United States Patent
Zhang et al.

(10) Patent No.: US 9,837,532 B2
(45) Date of Patent: Dec. 5, 2017

(54) LATERALLY DIFFUSED METAL OXIDE SEMICONDUCTOR DEVICE AND MANUFACTURING METHOD THEREFOR

(71) Applicant: CSMC TECHNOLOGIES FAB1 CO., LTD., Jiangsu (CN)

(72) Inventors: Guangsheng Zhang, Jiangsu (CN); Sen Zhang, Jiangsu (CN)

(73) Assignee: CSMC Technologies Fab1 Co., Ltd., Wuxi New District, Jiangsu (CN)

( * ) Notice: Subject to any disclaimer, the term of this patent is extended or adjusted under 35 U.S.C. 154(b) by 0 days.

(21) Appl. No.: 15/119,868

(22) PCT Filed: May 4, 2015

(86) PCT No.: PCT/CN2015/078216
§ 371 (c)(1),
(2) Date: Aug. 18, 2016

(87) PCT Pub. No.: WO2015/169196
PCT Pub. Date: Nov. 12, 2015

(65) Prior Publication Data
US 2017/0054018 A1    Feb. 23, 2017

(30) Foreign Application Priority Data

May 4, 2014    (CN) .......................... 2014 1 0185331

(51) Int. Cl.
*H01L 29/66*    (2006.01)
*H01L 29/78*    (2006.01)
*H01L 29/06*    (2006.01)

(52) U.S. Cl.
CPC ...... *H01L 29/7816* (2013.01); *H01L 29/0634* (2013.01); *H01L 29/66659* (2013.01); *H01L 29/66681* (2013.01); *H01L 29/7835* (2013.01)

(58) Field of Classification Search
CPC ............. H01L 29/0634; H01L 29/7816; H01L 29/1045
See application file for complete search history.

(56) References Cited

U.S. PATENT DOCUMENTS

2008/0138954 A1    6/2008 Cai
2012/0126323 A1    5/2012 Wu et al.

FOREIGN PATENT DOCUMENTS

CN    1901226    1/2007
CN    101740614    6/2010
(Continued)

OTHER PUBLICATIONS

Il-Yong Park et al., "Implementing Super Junction LDMOS Transistors to Overcome Substrate Depletion Effects", Nov. 2006, IEEE Circuits and Devices Magazine, Nov./Dec. 2006 Issue.*

(Continued)

*Primary Examiner* — Selim Ahmed
*Assistant Examiner* — Evan Clinton
(74) *Attorney, Agent, or Firm* — Hamre, Schumann, Mueller & Larson, P.C.

(57) ABSTRACT

A laterally diffused metal oxide semiconductor device includes: a substrate (10); a buried layer region (32) in the substrate; a well region (34) on the buried layer region (32); a gate region on the well region; a source region (41) and a drain region (43) which are located at two sides of the gate region; and a super junction structure. The source region (41) is located in the well region (34); the drain region (34) is located in the super junction structure; the gate region comprises a gate oxide layer and a gate electrode on the gate oxide layer; and the super junction structure comprises a plurality of N-columns and P-columns, wherein the N-columns and the P-columns are alternately arranged in a direction which is horizontal and is perpendicular to the direction of a connecting line between the source region and (Continued)

the drain region, each N-column comprises a top-layer N-region (23) and a bottom-layer N-region which are butted vertically, and each P-column comprises a top-layer P-region (24) and a bottom-layer P-region which are butted vertically.

10 Claims, 4 Drawing Sheets

(56) References Cited

FOREIGN PATENT DOCUMENTS

| CN | 101789435 | 7/2010 | |
|---|---|---|---|
| CN | 101819998 | 9/2010 | |
| CN | 101916728 | 12/2010 | |
| CN | 101916780 A * | 12/2010 | ......... H01L 29/0634 |
| CN | 102130013 | 7/2011 | |
| CN | 103165678 | 6/2013 | |
| CN | 103579351 A * | 2/2014 | |

OTHER PUBLICATIONS

International Search Report for PCT/CN2015/078216, dated Jul. 9, 2015, 6 pages including English translation.

\* cited by examiner

LATERALLY DIFFUSED METAL OXIDE SEMICONDUCTOR DEVICE AND MANUFACTURING METHOD THEREFOR

FIELD OF THE INVENTION

The present invention relates to semiconductors, and more particularly relates to a high voltage LDMOS device, and a manufacturing method of the high voltage LDMOS device.

BACKGROUND OF THE INVENTION

Laterally diffused metal oxide semiconductor (LDMOS) device mainly features that there is a relatively long lightly doped drift region between the channel region and the drain region, the drift region has the same doping type as that of the drain, thus it can play a role of balancing the breakdown voltage.

In super junction LDMOS, the lightly doped drift region of the conventional LDMOS is substituted by N-column regions and P-column regions which are arranged alternatively. Theoretically, due to the charge compensation between P/N column regions, a higher breakdown voltage of the super junction LDMOS can be obtained, and the N-column region can obtain a lower on-resistance due to its higher doping concentration, such that the super junction LDMOS can obtain a good balance between higher breakdown voltage and lower on-resistance.

The super junction LDMOS is substantially equivalent to implanting a PN junction into the drift region. When the device is working at the maximum breakdown voltage, the drift region can be completely depleted as much as possible. Accordingly, in addition to N-column regions withstand the main voltage, the depletion layer at the PN junction interface also withstands part of the voltage, therefore the super junction LDMOS can withstand higher breakdown voltage comparing to the conventional LDMOS.

In order to withstand an even higher breakdown voltage for the device, a width between P/N columns can be reduced, and a depth of the P/N columns can be increased. However, column region with too much depth will inevitably be accompanied by high-energy ion implantation, which may cause interior damage to the device. In addition, the high-energy ion implantation may result in an uneven distribution of the interior impurities of the column region, thus reducing the actual anti-breakdown capability.

SUMMARY OF THE INVENTION

Accordingly, it is necessary to provide a laterally diffused metal oxide semiconductor which can withstand a higher breakdown voltage.

A laterally diffused metal oxide semiconductor device includes: a substrate; a buried layer region having a second doping type formed in the substrate; a well region having the second doping type formed on the buried layer region; a gate region formed on the well region; a source region and a drain region having a first doping type located on both sides of the gate region; and a super junction structure; wherein the source region is located in the well region, the drain region is located in the super junction structure, the gate region includes a gate oxide layer and a gate formed on the gate oxide layer, the first doping type and the second doping type are opposite conductivity types, the super junction structure includes a plurality of N-columns and a plurality of P-columns, the plurality of N-columns and the plurality of P-columns are arranged alternately along a direction which is horizontal and is perpendicular to a connecting line between the source region and the drain region, each N-column includes a top-layer N-region and a bottom-layer N-region which are butted vertically; each P-column includes a top-layer P-region and a bottom-layer P-region which are butted vertically.

It is also necessary to provide a method of manufacturing a laterally diffused metal oxide semiconductor device.

A method of manufacturing a laterally diffused metal oxide semiconductor device includes the following steps: providing a substrate; forming a buried layer region having a second doping type, a plurality of bottom-layer N-regions and a plurality of bottom-layer P-regions in the substrate, wherein the bottom-layer N-regions and the bottom-layer P-regions are arranged alternately along a first dimension direction in a dimensional coordinate system; forming an epitaxial layer on the bottom-layer N-region, the bottom-layer P-region, and the buried layer by an epitaxial growth process; performing impurity ion implantation into the epitaxial layer, and performing drive-in to form a top-layer N-region, a top-layer P-region, and a well region having a second doping type; wherein after drive-in, each top-layer N-region abuts a bottom-layer N-region vertically to form a N-column, each top-layer P-region abuts a bottom-layer P-region vertically to form a P-column, the well region abuts the buried layer region vertically; forming a gate oxide layer and a gate on the well region; and forming a source region and a drain region having a first doping type, and a body lead-out region having a second doping type, wherein the source region and the drain region are formed on both sides of the gate oxide layer, a direction of a connecting line between the source region and the drain region is a second dimension direction in the dimensional coordinate system.

In the foregoing LDMOS device, the N-column and the P-column of the super junction structure are formed separately by two times of implantations, i.e., the bottom N-region/P-region is formed by the first implantation, after epitaxial process, the top N-region/P-region is formed by the second implantation, the required junction depth for each implantation is only half of that in the conventional process, such that a deeper P-column and N-column can be formed using lower implantation energy, thus increasing the breakdown voltage of the device. For the same reason, the time for high temperatures drive-in becomes shorter, thus saving manufacturing costs. The super junction of the drift region has a structure of alternatively arranged P-columns and N-columns, which leads to mutual depletion of the device during reverse withstanding, and a higher breakdown voltage is achieved through the conduction of top-layer N-region of the drift region during forward conduction.

BRIEF DESCRIPTION OF THE DRAWINGS

To illustrate the technical solutions according to the embodiments of the present invention or in the prior art more clearly, the accompanying drawings for describing the embodiments or the prior art are introduced briefly in the following. Apparently, the accompanying drawings in the following description are only some embodiments of the present invention, and persons of ordinary skill in the art can derive other drawings from the accompanying drawings without creative efforts.

DETAILED DESCRIPTION OF THE EMBODIMENTS

The above objects, features and advantages of the present invention will become more apparent by describing in detail embodiments thereof with reference to the accompanying drawings.

The First Embodiment

Figure 1:
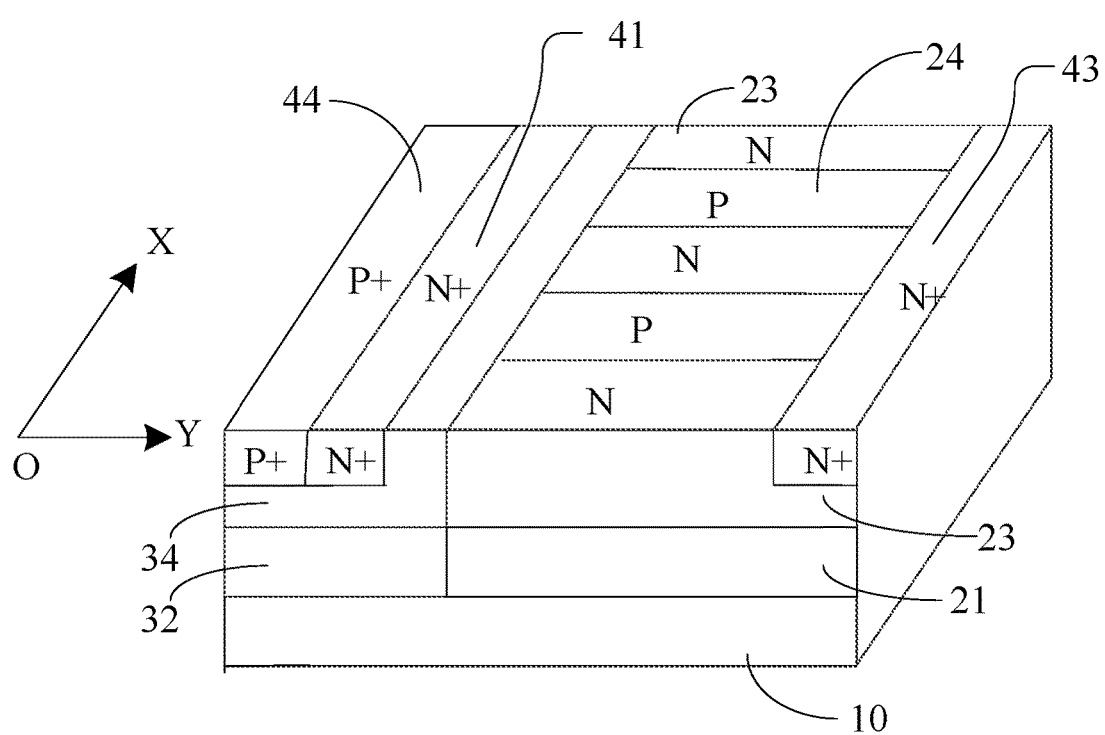
FIG. 1 is a schematic view of a laterally diffused metal oxide semiconductor device according to a first embodiment.

Referring to FIG. 1, a laterally diffused metal oxide semiconductor device according to the first embodiment includes a substrate 10, a buried layer region 32 having a second doping type formed in the substrate, a well region 34 having the second doping type formed on the buried layer region 32, a gate region (not shown in FIG. 1) formed on the well region 34, a source region 41 and a drain region 43 having a first doping type located on both sides of the gate region, and a drift region having a super junction structure. In the illustrated embodiment, the first doping type is N-type; and the second doping type is P-type, and the substrate 10 is a P-type substrate. The source region 41 is located in the well region 43, and the drain region 43 is located in the super junction structure. The gate region includes a gate oxide layer (not shown in FIG. 1) and a gate (not shown in FIG. 1) formed on the gate oxide layer. The super junction structure includes a plurality of N-columns and a plurality of P-columns. The plurality of N-columns and the plurality of P-columns are arranged alternately along a direction which is horizontal and is perpendicular to a connecting line between the source region 41 and the drain region 43, in other words, the plurality of N-columns and the plurality of P-columns are arranged alternately along an X-axis direction of a two-dimensional coordinate system XOY of FIG. 1. Each N-column includes a top-layer N-region 23 and a bottom-layer N-region 21 which are butted vertically; each P-column includes a top-layer P-region 24 and a bottom-layer P-region (not shown in FIG. 1) which are butted vertically. The embodiment illustrated in FIG. 1 further includes a P-type body lead-out region 44 located in the well region 34, and the body lead-out region 44 is located at a side of the source region 41 away from the drain region 43. A doping concentration of the body lead-out region 44 is greater than that of the well region 34, and a doping concentration of the drain region 43 is greater than that of the top-layer N-region 23.

Figure 2:
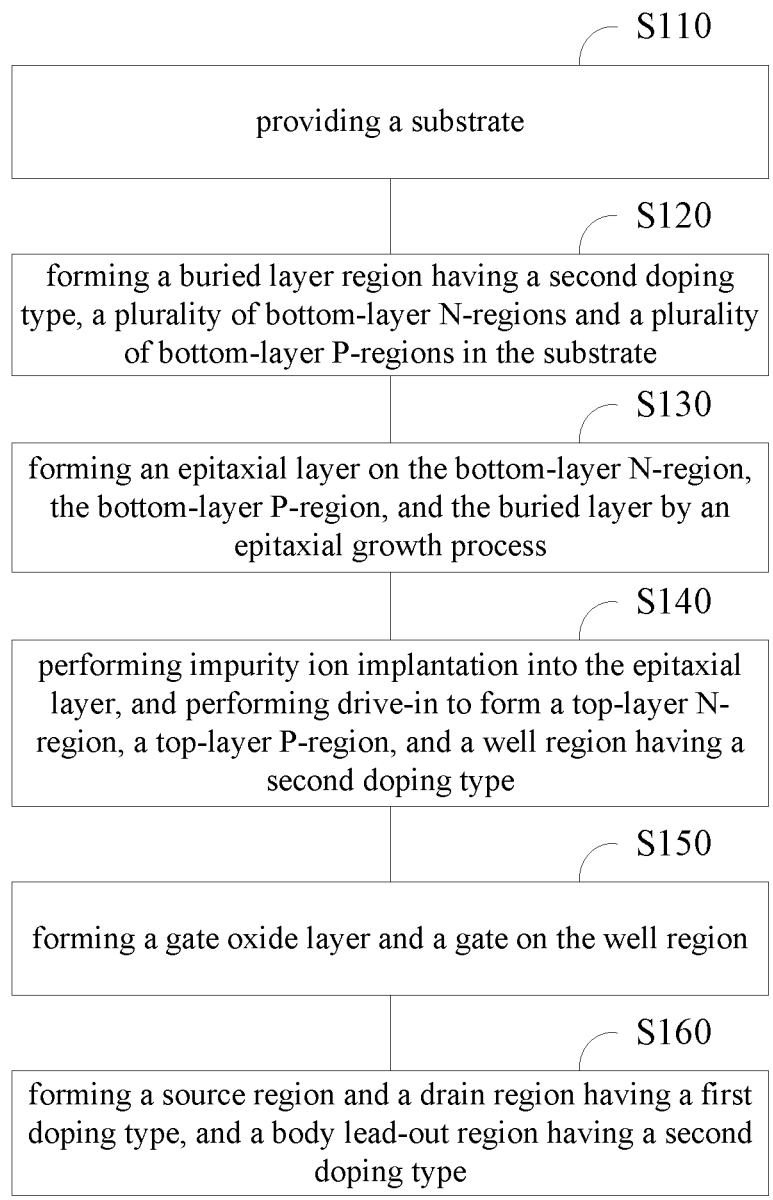
FIG. 2 is a flow chart of a method of manufacturing the laterally diffused metal oxide semiconductor device of FIG. 1.

FIG. 2 is a flow chart of a method of manufacturing the laterally diffused metal oxide semiconductor device of FIG. 1, the method includes the following steps:

In step S110, a substrate is provided.

The substrate can be various types of substrate, such as a SOI substrate, a bulk silicon substrate or a sapphire substrate, etc. In the illustrated embodiment, the substrate 10 is a P-type substrate.

In step S120, a buried layer region having a second doping type, a plurality of bottom-layer N-regions and a plurality of bottom-layer P-regions are formed in the substrate.

By conventional ion implantation or other techniques, a P-type buried layer region 32 is formed as a buried layer P-well, and meanwhile the plurality of bottom-layer N-regions 21 and the bottom-layer P-regions are formed in the drift region. The bottom-layer N-regions 21 and the bottom-layer P-regions are alternative arranged along the X-axis direction.

In step S130, an epitaxial layer is formed on the bottom-layer N-region, the bottom-layer P-region, and the buried layer by an epitaxial growth process.

In the illustrated embodiment, the epitaxial layer has the same doping type as that of the substrate.

In step S140, impurity ion implantation is performed into the epitaxial layer, and drive-in is performed to form a top-layer N-region, a top-layer P-region, and a well region having a second doping type.

In the illustrated embodiment, the top-layer N-region 23 is formed above the bottom-layer N-region 21, and the well region 34 is formed above the buried layer region 32 (buried layer P-well). After drive-in, each top-layer N-region 23 abuts a bottom-layer N-region 21 vertically to form an N-column, each top-layer P-region 24 abuts a bottom-layer P-region vertically to form a P-column, and the well region 34 abuts the buried layer region 32 vertically.

In step S150, a gate oxide layer and a gate is formed on the well region.

In the illustrated embodiment, the gate oxide layer is formed on the well region 34 adjacent to the drift region (top-layer N-region 23) by thermal oxidation method, poly-silicon is then deposited, after photolithography, the remaining polysilicon gate along with the gate oxide layer form the gate region.

In step S160, a source region and a drain region having a first doping type, and a body lead-out region having a second doping type are formed.

The device manufactured after step S160 is shown in FIG. 1, in which the N-type source region 41 is formed in the well region 34, and the N-type drain region 43 is formed in the super junction structure. The connecting line direction of the source region 41 and the drain region 43 is a Y-axis direction in the XOY coordinate system. The body lead-out region 44 is located at a side of the source region 41 away from the drain region 43.

In the foregoing LDMOS device, the N-column and the P-column of the super junction structure are formed separately by two times of implantations, i.e., the bottom N-region/P-region is formed by the first implantation, after epitaxial process, the top N-region/P-region is formed by the second implantation, the required junction depth for each implantation is only half of that in the conventional process, such that a deeper P-column and N-column can be formed using lower implantation energy, thus increasing the breakdown voltage of the device. For the same reason, the time for high temperatures drive-in becomes shorter, thus saving manufacturing costs. The super junction of the drift region has a structure of alternatively arranged P-columns and N-columns, which leads to mutual depletion of the device during reverse withstanding, and a higher breakdown voltage is achieved through the conduction of top-layer N-region of the drift region during forward conduction.

The Second Embodiment

Figure 3:
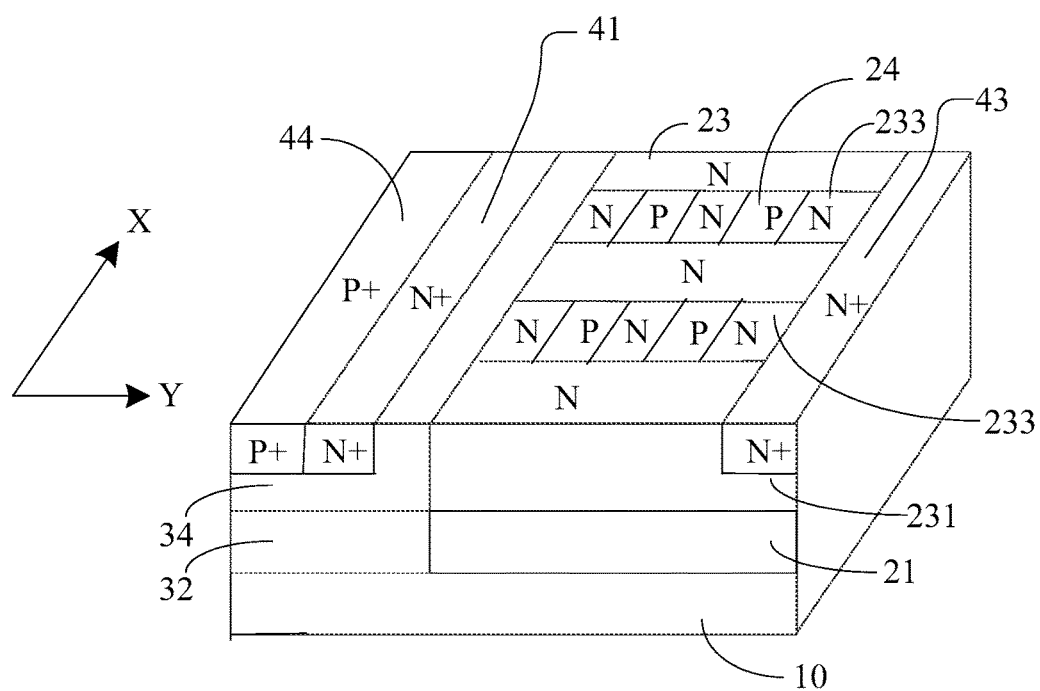
FIG. 3 is a schematic view of a laterally diffused metal oxide semiconductor device according to a second embodiment.
Figure 4:
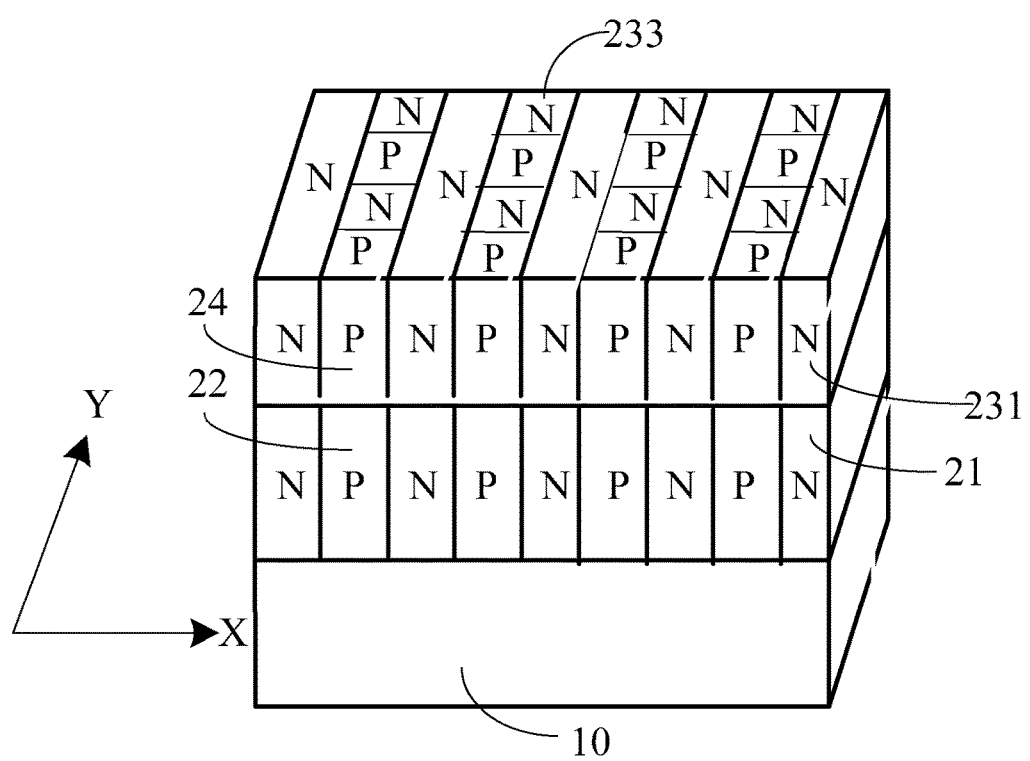
FIG. 4 is a cross-sectional view of a drift region of the laterally diffused metal oxide semiconductor device of FIG. 3.

FIG. 3 is a schematic view of a laterally diffused metal oxide semiconductor device according to a second embodiment; FIG. 4 is a cross-sectional view of a drift region of the laterally diffused metal oxide semiconductor device of FIG.

3, and it should be noted that the projection directions of FIG. 3 and FIG. 4 are different. In the illustrated embodiment, the N-column includes an elongated N-column and a staggered N-column. The elongated N-column includes a top-layer N-region 231 exposed on the top showing in FIG. 3, the staggered N-column includes a top-layer N-region 233 exposed on the top showing in FIG. 3. The elongated N-column extends the connecting line direction of the source region 41 and the drain region 43, and the elongated N-columns are arranged alternately along the X-axis direction. The staggered N-column and the P-column (including the top-layer P-region 24 and the bottom layer P-region 22) are filled between adjacent two elongated N-columns. The staggered N-columns and the P-columns are arranged alternately along the direction of the connecting line between the source region 41 and the drain region 43.

In the super junction structure of the second embodiment, a contacting area between the P-columns and N-columns are further increased, i.e., an area of the depletion region of PN junction inside the drift region is increased, thus a higher breakdown voltage can be obtained.

Although the description is illustrated and described herein with reference to certain embodiments, the description is not intended to be limited to the details shown. Modifications may be made in the details within the scope and range equivalents of the claims.

What is claimed is:

1. A laterally diffused metal oxide semiconductor device, comprising:
   a substrate;
   a buried layer region having a second doping type formed in the substrate;
   a well region having the second doping type formed on the buried layer region;
   a gate region formed on the well region;
   a source region and a drain region having a first doping type located on both sides of the gate region; and
   a super junction structure;
   wherein the source region is located in the well region, the drain region is located in the super junction structure, the gate region comprises a gate oxide layer and a gate formed on the gate oxide layer, the first doping type and the second doping type are opposite conductivity types, the super junction structure comprises a plurality of N-columns and a plurality of P-columns, the plurality of N-columns and the plurality of P-columns are arranged alternately along a direction which is horizontal and is perpendicular to a connecting line between the source region and the drain region, each N-column comprises a top-layer N-region and a bottom-layer N-region which are butted vertically; each P-column comprises a top-layer P-region and a bottom-layer P-region which are butted vertically, and
   wherein the N-column comprises an elongated N-column and a staggered N-column, the elongated N-column extends along a direction of the connecting line between the source region and the drain region, and the elongated N-columns are arranged alternately along the direction which is horizontal and is perpendicular to the connecting line between the source region and the drain region; the staggered N-column and the P-column are filled between adjacent two elongated N-columns; the staggered N-columns and the P-columns are arranged alternately along the direction of the connecting line between the source region and the drain region.

2. The laterally diffused metal oxide semiconductor device according to claim 1, wherein the first doping type is N-type; and the second doping type is P-type.

3. The laterally diffused metal oxide semiconductor device according to claim 2, further comprising a P-type body lead-out region located in the well region, wherein the body lead-out region is located at a side of the source region away from the drain region.

4. The laterally diffused metal oxide semiconductor device according to of claim 3, wherein the N-column comprises an elongated N-column and a staggered N-column, the elongated N-column extends along a direction of the connecting line between the source region and the drain region, and the elongated N-columns are arranged alternately along the direction which is horizontal and is perpendicular to the connecting line between the source region and the drain region; the staggered N-column and the P-column are filled between adjacent two elongated N-columns; the staggered N-columns and the P-columns are arranged alternately along the direction of the connecting line between the source region and the drain region.

5. A method of manufacturing a laterally diffused metal oxide semiconductor device, comprising the following steps:
   providing a substrate;
   forming a buried layer region having a second doping type, a plurality of bottom-layer N-regions and a plurality of bottom-layer P-regions in the substrate, wherein the bottom-layer N-regions and the bottom-layer P-regions are arranged alternately along a first dimension direction in a dimensional coordinate system;
   forming an epitaxial layer on the bottom-layer N-region, the bottom-layer P-region, and the buried layer by an epitaxial growth process;
   performing impurity ion implantation into the epitaxial layer, and performing drive-in to form a top-layer N-region, a top-layer P-region, and a well region having a second doping type; wherein after drive-in, each top-layer N-region abuts a bottom-layer N-region vertically to form a N-column, each top-layer P-region abuts a bottom-layer P-region vertically to form a P-column, the well region abuts the buried layer region vertically;
   forming a gate oxide layer and a gate on the well region; and
   forming a source region and a drain region having a first doping type, and a body lead-out region having a second doping type, wherein the source region and the drain region are formed on both sides of the gate oxide layer, a direction of a connecting line between the source region and the drain region is a second dimension direction in the dimensional coordinate system,
   wherein the N-column comprises an elongated N-column and a staggered N-column, the elongated N-column extends along the second dimension direction, the elongated N-columns are arranged alternately along the first dimension direction; the staggered N-column and the P-column are filled between adjacent two elongated N-columns; the staggered N-columns and the P-columns are arranged alternately along the second dimension direction.

6. The method according to claim 5, wherein the first doping type is N-type; and the second doping type is P-type.

7. The method according to claim 5, wherein the body lead-out region is located at a side of the source region away from the drain region.

8. The method according to claim 5, wherein the two-dimensional coordinate system is a Cartesian coordinate system.

9. The method according to claim 5, wherein during forming the epitaxial layer on the bottom-layer N-region, the bottom-layer P-region, and the buried layer by the epitaxial growth process, a doping type of the epitaxial layer is in consistent with a doping type of the substrate.

10. A laterally diffused metal oxide semiconductor device, comprising:
- a substrate;
- a buried layer region having a second doping type formed in the substrate;
- a well region having the second doping type formed on the buried layer region;
- a gate region formed on the well region;
- a source region and a drain region having a first doping type located on both sides of the gate region; and
- a super junction structure;
- wherein the source region is located in the well region, the drain region is located in the super junction structure, the gate region comprises a gate oxide layer and a gate formed on the gate oxide layer, the first doping type and the second doping type are opposite conductivity types, the super junction structure comprises a plurality of N-columns and a plurality of P-columns, the plurality of N-columns and the plurality of P-columns are arranged alternately along a direction which is horizontal and is perpendicular to a connecting line between the source region and the drain region, each N-column comprises a top-layer N-region and a bottom-layer N-region which are butted vertically; each P-column comprises a top-layer P-region and a bottom-layer P-region which are butted vertically, wherein the first doping type is N-type; and the second doping type is P-type, and wherein the N-column comprises an elongated N-column and a staggered N-column, the elongated N-column extends along a direction of the connecting line between the source region and the drain region, and the elongated N-columns are arranged alternately along the direction which is horizontal and is perpendicular to the connecting line between the source region and the drain region; the staggered N-column and the P-column are filled between adjacent two elongated N-columns; the staggered N-columns and the P-columns are arranged alternately along the direction of the connecting line between the source region and the drain region.

* * * * *